(12) United States Patent
Shalvi et al.

(10) Patent No.: US 8,750,046 B2
(45) Date of Patent: Jun. 10, 2014

(54) STORAGE AT M BITS/CELL DENSITY IN N BITS/CELL ANALOG MEMORY CELL DEVICES, M>N

(71) Applicant: Apple Inc., Cupertino, CA (US)

(72) Inventors: Ofir Shalvi, Ra'anana (IL); Naftali Sommer, Rishon Le-Zion (IL); Uri Perlmutter, Ra'anana (IL); Dotan Sokolov, Ra'anana (IL)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/041,219

(22) Filed: Sep. 30, 2013

(65) Prior Publication Data

US 2014/0029338 A1 Jan. 30, 2014

Related U.S. Application Data

(63) Continuation of application No. 13/449,326, filed on Apr. 18, 2012, now Pat. No. 8,547,742, which is a continuation of application No. 12/618,732, filed on Nov. 15, 2009, now Pat. No. 8,208,304.

(60) Provisional application No. 61/144,566, filed on Jan. 14, 2009, provisional application No. 61/144,629, filed on Jan. 14, 2009, provisional application No. 61/115,086, filed on Nov. 16, 2008.

(51) Int. Cl.
*G11C 16/04* (2006.01)

(52) U.S. Cl.
USPC .............. 365/185.12; 365/185.21; 365/185.24

(58) Field of Classification Search
USPC ............. 365/185.12, 185.21, 185.24, 185.03, 365/185.02, 185.33
See application file for complete search history.

(56) References Cited

U.S. PATENT DOCUMENTS 7,505,315 B2 * 3/2009 Honma et al. ........... 365/185.03

* cited by examiner

*Primary Examiner* — David Lam
(74) *Attorney, Agent, or Firm* — Meyertons, Hood, Kivlin, Kowert & Goetzel, P.C.

(57) ABSTRACT

A method for data storage includes accepting data for storage in a memory that includes multiple analog memory cells and supports a set of built-in programming commands. Each of the programming commands programs a respective page, selected from a group of N pages, in a subset of the memory cells. The subset of the memory cells is programmed to store M pages of the data, M>N, by performing a sequence of the programming commands drawn only from the set.

20 Claims, 6 Drawing Sheets

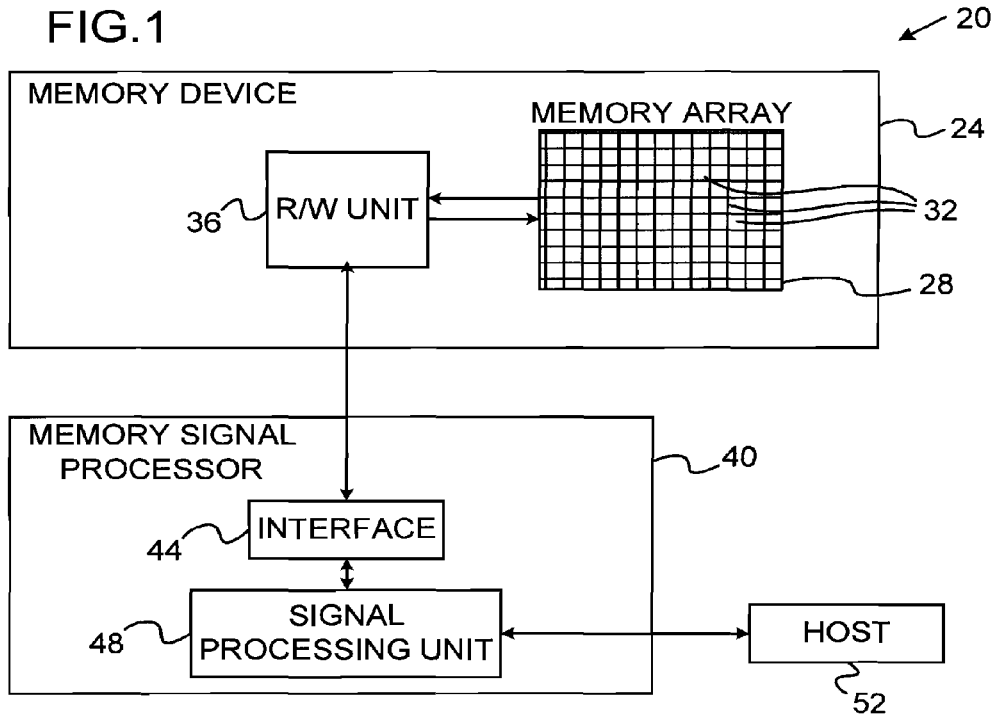
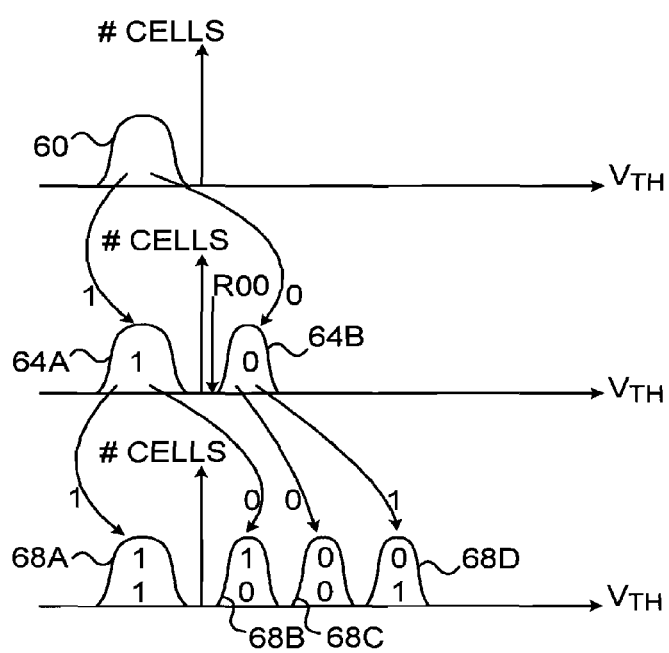

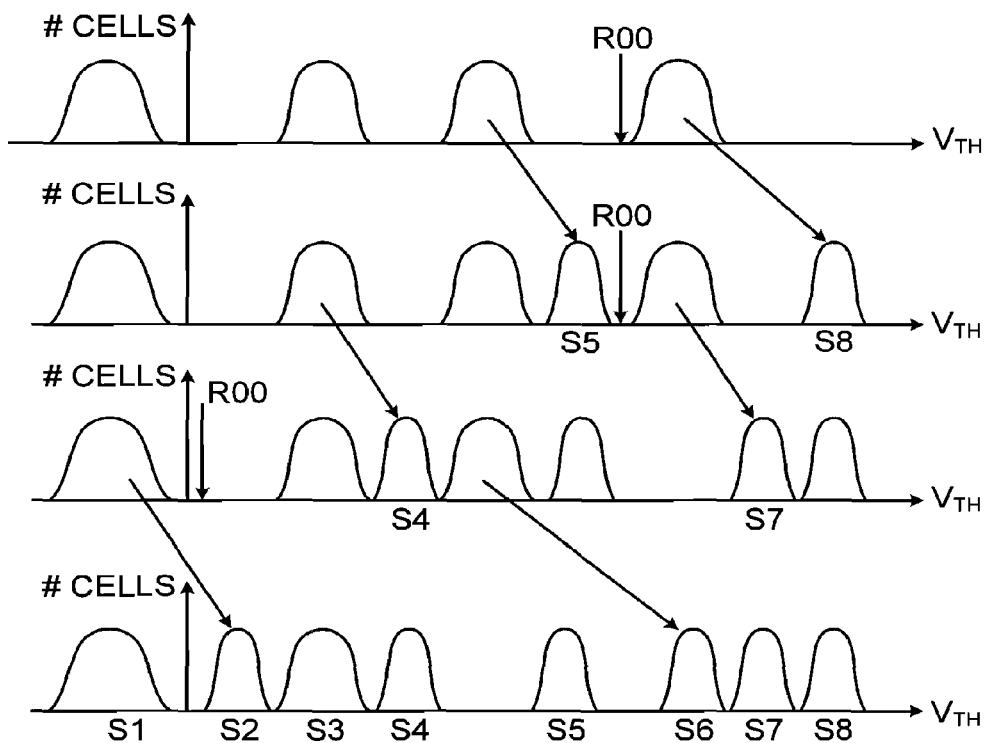
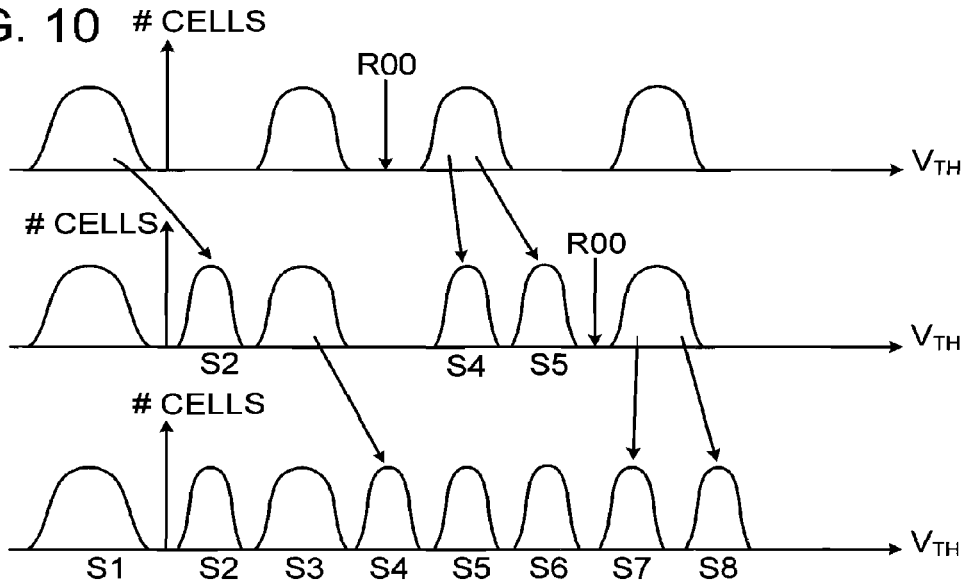

STORAGE AT M BITS/CELL DENSITY IN N BITS/CELL ANALOG MEMORY CELL DEVICES, M>N

This application is a continuation of U.S. patent application Ser. No. 13/449,326, filed Apr. 18, 2012 now U.S. Pat. No. 8,547,742, which is a continuation of U.S. patent application Ser. No. 12/618,732, filed Nov. 15, 2009, now U.S. Pat. No. 8,208,304, issued Jun. 26, 2012 which is a non-provisional of U.S. patent application Ser. No. 61/144,566 filed Jan. 14, 2009, U.S. patent application Ser. No. 61/115,086 filed Nov. 16, 2007 and U.S. patent application Ser. No. 61/144,629 filed Jan. 14, 2009 which is incorporated herein by reference in its entirety.

FIELD OF THE INVENTION

The present invention relates generally to memory devices, and particularly to methods and systems for high-density storage in analog memory cells.

BACKGROUND OF THE INVENTION

Several types of memory devices, such as Flash memories, use arrays of analog memory cells for storing data. Each analog memory cell stores a quantity of an analog value, also referred to as a storage value, such as an electrical charge or voltage. This analog value represents the information stored in the cell. In Flash memories, for example, each analog memory cell holds a certain amount of electrical charge. The range of possible analog values is typically divided into intervals, each interval corresponding to one or more data bit values. Data is written to an analog memory cell by writing a nominal analog value that corresponds to the desired bit or bits.

Some memory devices, commonly referred to as Single-Level Cell (SLC) devices, store a single bit of information in each memory cell, i.e., each memory cell can be programmed to assume either of two possible programming levels. Higher-density devices, often referred to as Multi-Level Cell (MLC) devices, store two or more bits per memory cell, i.e., can be programmed to assume more than two possible programming levels.

SUMMARY OF THE INVENTION

An embodiment of the present invention provides a method for data storage, including:
accepting data for storage in a memory that includes multiple analog memory cells and supports a set of built-in programming commands, each of which programming commands programs a respective page, selected from a group of N pages, in a subset of the memory cells; and
programming the subset of the memory cells to store M pages of the data, M>N, by performing a sequence of the programming commands drawn only from the set.

In some embodiments, the memory further supports a list of built-in read commands, each of which read commands reads a respective one of the group of the N pages, and the method includes reading the M pages from the subset of the memory cells by performing a series of read commands drawn only from the list. In an embodiment, performing the series of the read commands includes notifying the memory of one or more read threshold values to be applied in at least one of the read commands in the series.

In a disclosed embodiment, programming the subset of the memory cells includes caching the data in the memory in no more than N page buffers. In another embodiment, programming the subset of the memory cells includes notifying the memory of one or more programming threshold values to be applied in at least one of the programming commands in the sequence. In yet another embodiment, programming the subset of the memory cells includes applying a series of programming pulses to the memory cells in the subset, and notifying the memory of a characteristic of the programming pulses to be applied during at least one of the programming commands in the sequence. In an embodiment, a given programming command in the sequence involves reading a previously-programmed page from the subset of the memory cells using one or more read thresholds, and programming the subset of the memory cells includes notifying the memory of respective values of the one or more read thresholds.

In a disclosed embodiment, programming the subset of the memory cells includes, during a given programming command in the sequence, modifying respective storage values of only some of the memory cells in the subset by programming the other memory cells in the subset with respective data values that cause their storage values to remain unchanged by the given programming command. In an embodiment, the method includes configuring the memory to operate in one of first and second operational modes, and programming the subset of the memory cells includes storing a maximum of M pages in the subset of the memory cells when operating in the first operational mode, and storing a maximum of N pages in the subset of the memory cells when operating in the second operational mode.

There is additionally provided, in accordance with an embodiment of the present invention, a data storage apparatus, including:
an interface for communicating with a memory that includes multiple analog memory cells and supports a set of built-in programming commands, each of which programming commands programs a respective page, selected from a group of N pages, in a subset of the memory cells; and
a processor, which is configured to accept data for storage in the memory, and to program the subset of the memory cells to store M pages of the data, M>N, by performing a sequence of the programming commands drawn only from the set.

There is also provided, in accordance with an embodiment of the present invention, a data storage apparatus, including:
a memory, which includes multiple analog memory cells and supports a set of built-in programming commands, each of which programming commands programs a respective page, selected from a group of N pages, in a subset of the memory cells; and
a processor, which is configured to accept data for storage in the memory, and to program the subset of the memory cells to store M pages of the data, M>N, by performing a sequence of the programming commands drawn only from the set.

There is further provided, in accordance with an embodiment of the present invention, a method for data storage, including:
accepting data for storage in a memory that includes multiple analog memory cells and supports a set of built-in programming commands for programming the memory cells to a first number of programming states; and
programming the memory cells to a second number of programming states, which is less than the first number and is not an integer power of two, by performing a sequence of the programming commands drawn only from the set.

There is additionally provided, in accordance with an embodiment of the present invention, a method for data storage, including:

accepting a request to retrieve data from a memory, which includes multiple analog memory cells, holds M pages of the data in a subset of the memory cells, and supports a list of built-in read commands, each of which read commands reads a respective one of N pages, N<M; and responsively to the request, reading the M pages from the subset of the memory cells by performing a series of read commands drawn only from the list.

The present invention will be more fully understood from the following detailed description of the embodiments thereof, taken together with the drawings in which:

BRIEF DESCRIPTION OF THE DRAWINGS

FIG. 1 is a block diagram that schematically illustrates a memory system, in accordance with an embodiment of the present invention;

FIG. 2 is a diagram showing programming levels and a set of built-in programming commands, in accordance with an embodiment of the present invention;

FIGS. 8-10 are diagrams showing processes of data storage at three bits/cell using two bits/cell programming commands, in accordance with alternative embodiments of the present invention;

DETAILED DESCRIPTION OF EMBODIMENTS

Overview

Figure 3:
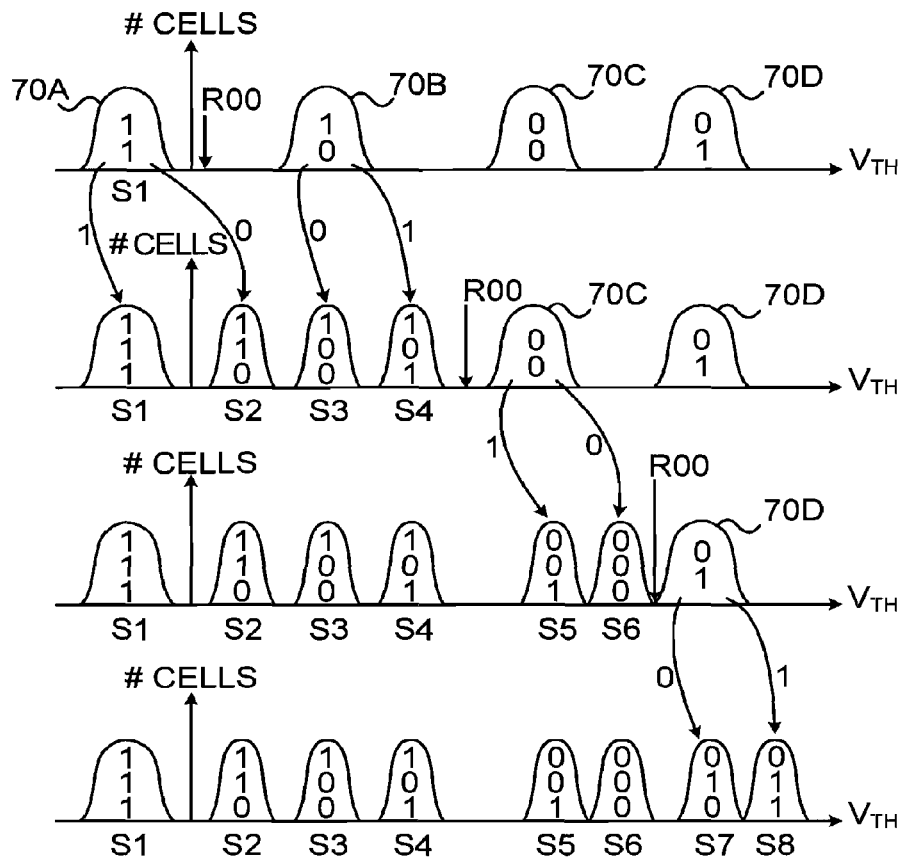
FIG. 3 is a diagram showing a process of storing data at three bits/cell using two bits/cell programming commands, in accordance with an embodiment of the present invention.

A Multi-Level Cell (MLC) memory device comprises multiple analog memory cells, which store data at a density of two or more bits/cell. Typically, the data is stored by programming each memory cell to one of multiple predefined analog storage values (e.g., electrical charge levels or threshold voltages). Each analog storage value corresponds to a respective programming state (also referred to as a programming level), which represents the particular combination of bit values stored in that memory cell. For example, four-level MLC devices use four programming states to store data at a density of two bits/cell. Eight-level MLC devices store three bits/cell using eight programming states.

In the description that follows, the two bits of a four-level memory cell are referred to as $BIT_0$ and $BIT_1$, and the three bits of an eight-level memory cell are referred to as $BIT_0$, $BIT_1$ and $BIT_2$. Typically, different MLC bits in a given group of memory cells correspond to different memory pages. For example, a group of four-level memory cells can be used to store one memory page in the cells' $BIT_0$s, and another memory page in the cells' $BIT_1$s. A group of eight-level memory cells can be used to store three memory pages, one page in the $BIT_0$s, another page in the $BIT_1$s, and a third page in the $BIT_2$s of the cells. These memory pages are referred to herein as PAGE0, PAGE1 and PAGE2, respectively.

Typically, a memory device that is designed to store data at a certain density supports a set of built-in programming commands. Each command in the set stores data in a certain page of a group of memory cells. For example, a memory device designed to store two bits/cell typically supports two built-in programming commands, referred to as a PAGE_0 programming command and a PAGE_1 programming command.

Embodiments of the present invention that are described hereinbelow provide methods and systems for high-density storage in analog memory cells. These methods and systems enable a memory device, which is originally designed to store data at N bits/cell, to store data at a higher density of M bits/cell, where M>N.

In some embodiments, a memory device that includes multiple analog memory cells supports a set of built-in programming commands. Each command in the set programs a certain page out of N possible pages in a group of memory cells. A Memory Signal Processor (MSP) or other processor stores data in this memory device at a density of M bits/cell, M>N. The MSP stores M pages in a group of memory cells by performing a sequence of programming commands, which are drawn only from the set of built-in programming commands supported by the memory device. For example, the MSP may store three memory pages in a group of analog memory cells by performing a sequence of PAGE_0 and PAGE_1 programming commands. Command attributes are chosen so that the end result is a group of memory cells that are programmed to $2^M$ different programming states, even though the built-in programming commands only go as far as programming $2^N$ states. Several example programming schemes are described in detail below.

In some embodiments, the memory device in question supports a set of built-in read commands. Each read command in the set reads from a group of memory cells a certain page out of N possible pages. The MSP reads M pages (M>N) from each memory cell in a given cell group by performing a series of read commands, which are drawn only from the set of built-in read commands supported by the memory device.

By using the methods and systems described herein, legacy memory devices can be used to store data at a higher density than they were originally designed for. As a result, the cost of memory systems can be reduced and storage capacity can be increased. Additionally, the disclosed techniques can extend the effective lifetime of a given memory fabrication process, and allow a gradual migration path toward higher-density processes.

In some embodiments, a given memory device may support two operational modes. One mode (a "high-reliability mode") stores data at N bits/cell. The other mode (a "high-capacity mode") stores data at M bits/cell. The selection whether to operate the memory device in the high-reliability or in the high-capacity mode can be made, for example, during production. Such dual-mode operation enables memory manufacturers to enjoy the economy-of-scale benefits of producing large volumes of a given design, while at the same time offering multiple products having different storage capacities.

Moreover, in some memory devices, the size and complexity of internal hardware (e.g., page buffers and reading/writing circuitry) grows with the device's specified storage density. The disclosed methods and systems enable using a low-density memory device, whose internal hardware is relatively small and simple, for storing data at high density. As a result, the cost, size and complexity of memory devices can be reduced.

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules ("disk-on-key" devices), Solid State Disks (SSD), digital cameras, music and other media players and/or any other system or device in which data is stored and retrieved.

System 20 comprises a memory device 24, which stores data in a memory cell array 28. The memory array comprises multiple analog memory cells 32. In the context of the present patent application and in the claims, the term "analog memory cell" is used to describe any memory cell that holds a continuous, analog value of a physical parameter, such as an electrical voltage or charge. Array 32 may comprise analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells.

The charge levels stored in the cells and/or the analog voltages or currents written into and read out of the cells are referred to herein collectively as analog values, storage values or analog storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values into the cell.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells 32 into digital samples having a resolution of one or more bits. Data is typically written to and read from the memory cells in groups that are referred to as pages. In some embodiments, the R/W unit can erase a group of cells 32 by applying one or more negative erasure pulses to the cells.

The storage and retrieval of data in and out of memory device 24 is performed by a Memory Signal Processor (MSP) 40. MSP 40 comprises an interface 44 for communicating with memory device 24, and a signal processing unit 48, which processes the data that is written into and read from device 24. In particular, when memory device 24 comprises an N bits/cell device, unit 48 may store data in device 24 at a density of M>N bits/cell, using methods that are described below.

In some embodiments, unit 48 produces the storage values for storing in the memory cells and provides these values to R/W unit 36. Alternatively, unit 48 provides the data for storage, and the conversion to storage values is carried out by the R/W unit internally to the memory device. Alternatively to using an MSP, the methods described herein can be carried out by any suitable type of memory controller.

MSP 40 communicates with a host 52, for accepting data for storage in the memory device and for outputting data retrieved from the memory device. MSP 40, and in particular unit 48, may be implemented in hardware. Alternatively, MSP 40 may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. For example, although the example of FIG. 1 shows a single memory device, in alternative embodiments MSP 40 may control multiple memory devices 24. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory device 24 and MSP 40 are implemented as two separate Integrated Circuits (ICs). In alternative embodiments, however, the memory device and the MSP may be integrated on separate semiconductor dies in a single Multi-Chip Package (MCP) or System on Chip (SoC), and may be interconnected by an internal bus. Further alternatively, some or all of the MSP circuitry may reside on the same die on which the memory array is disposed. Further alternatively, some or all of the functionality of MSP 40 can be implemented in software and carried out by a processor or other element of the host system. In some embodiments, host 44 and MSP 40 may be fabricated on the same die, or on separate dies in the same device package.

In some embodiments, MSP 40 (or other memory controller that carries out the methods described herein) comprises a general-purpose processor, which is programmed in software to carry out the functions described herein. The software may be downloaded to the processor in electronic form, over a network, for example, or it may, alternatively or additionally, be provided and/or stored on tangible media, such as magnetic, optical, or electronic memory.

In an example configuration of array 28, memory cells 32 are arranged in multiple rows and columns, and each memory cell comprises a floating-gate transistor. The gates of the transistors in each row are connected by word lines, and the sources of the transistors in each column are connected by bit lines. The memory array is typically divided into multiple pages, i.e., groups of memory cells that are programmed and read simultaneously.

Pages are sometimes sub-divided into sectors. In some embodiments, each page occupies an entire row of the array, i.e., an entire word line. For two-bit-per-cell devices, for example, each word line stores two pages. In alternative embodiments, each row (word line) can be divided into two or more pages. For example, in some devices each row is divided into two pages, one comprising the odd-order cells and the other comprising the even-order cells. In an example implementation, a two-bit-per-cell memory device may have four pages per row, a three-bit-per-cell memory device may have six pages per row, and a four-bit-per-cell memory device may have eight pages per row.

Erasing of cells is usually carried out in blocks that contain multiple pages. Typical memory devices may comprise several thousand erasure blocks. In a typical two-bit-per-cell MLC device, each erasure block is on the order of 32 word lines, each comprising several thousand cells. Each word line of such a device is often partitioned into four pages (odd/even order cells, least/most significant bit of the cells). Three-bit-per cell devices having 32 word lines per erasure block would have 192 pages per erasure block, and four-bit-per-cell devices would have 256 pages per block. Alternatively, other block sizes and configurations can also be used. Some memory devices comprise two or more separate memory cell arrays, often referred to as planes. Since each plane has a certain "busy" period between successive write operations, data can be written alternately to the different planes in order to increase programming speed.

A given memory device 24 is typically designed and specified to store data at a given density of N bits/cell. The bits stored in each memory cell are denoted $BIT_0 \ldots BIT_{N-1}$. Typically, different bits in a given group of memory cells correspond to different memory pages. For example, a group of four-level memory cells can be used to store one memory page in the cells' $BIT_0$s, and another memory page in the cells' $BIT_1$s. A group of eight-level memory cells can be used to store three memory pages, one page in the $BIT_0$s, another page in the $BIT_1$s, and a third page in the $BIT_2$s of the cells. These memory pages are referred to herein as PAGE0, PAGE1 and PAGE2, respectively.

Specifying a memory device to store N bits/cell may affect various aspects of the device's design. For example, the memory device typically supports a set of built-in programming commands, which program the N bits of each memory cell. Each command in the set stores data in a certain bit of a group of memory cells, and typically corresponds to storage of a memory page. For example, a memory device designed to store two bits/cell typically supports two built-in programming commands, referred to as a PAGE_0 programming command and a PAGE_1 programming command. A 3 bits/cell device typically supports three built-in programming commands—for programming PAGE_0, PAGE_1 and PAGE_2 in a given group of memory cells. Typically R/W unit 36 of the memory device stores data in array 28 by executing the built-in programming commands, in response to instructions from the MSP or other memory controller.

FIG. 2 is a diagram showing programming levels and a set of built-in programming commands in an example memory device, in accordance with an embodiment of the present invention. In the present example, the memory device comprises a 2 bit/cell device, and the set of built-in programming commands consists of a PAGE_0 programming command and a PAGE_1 programming command. The figure shows three graphs, which show the threshold voltage distribution in a group of memory cells at various programming stages.

The top graph shows the threshold voltage distribution when the cell group in question is erased, i.e., prior to programming. At this stage, the threshold voltages of the memory cells are distributed in accordance with a distribution 60. Typically although not necessarily, erased cells are assigned negative threshold voltages.

The middle graph shows the threshold voltage distribution after applying the PAGE_0 programming command. The PAGE_0 programming command programs the memory cells in the group to store PAGE0, i.e., programs $BIT_0$s of the memory cells. Memory cells whose $BIT_0$="1" remain programmed with the negative threshold voltage, i.e., are associated with a distribution 64A. Memory cells whose $BIT_0$="0" are programmed to a programming state that is associated with a distribution 64B. Generally, distribution 64A may have a different (typically smaller) variance than distribution 60.

The bottom graph in FIG. 2 shows the threshold voltage distribution after applying the PAGE_1 programming command, which programs the memory cells in the group to store PAGE1, i.e., programs $BIT_1$s of the memory cells. Memory cells whose $BIT_0$ was "1" and whose $BIT_1$ is now programmed to "1" remain programmed with the negative threshold voltage, i.e., are associated with a distribution 68A. Memory cells whose $BIT_0$="1" and whose $BIT_1$="0" are programmed to a programming state that is associated with a distribution 68B. Memory cells whose $BIT_0$="0" and whose $BIT_1$="0" are programmed to a programming state that is associated with a distribution 68C. Memory cells whose $BIT_0$="0" and whose $BIT_1$="1" are programmed to a programming state that is associated with a distribution 68D.

Note that when programming PAGE1, the programming state of a given memory cell depends on the value of $BIT_1$ that is currently being programmed, and also on the value of $BIT_0$ that was previously programmed in that memory cell. Therefore, in some embodiments, the built-in PAGE_1 programming command involves reading the $BIT_0$ values from the memory cells in the group, and then programming the memory cells to the appropriate programming states based on both $BIT_0$ and $BIT_1$ values. In the present example, R/W unit 36 reads the $BIT_0$ values by comparing the threshold voltages of the memory cells to a read threshold denoted R00. In the example of FIG. 2, R00 is located near 0V. In some embodiments, the position of read threshold R00 can be set and modified by the MSP.

Typically, R/W unit 36 programs the memory cells to the different memory states using an iterative Program and Verify (P&V) process. In this sort of process, the R/W unit applies a sequence of programming pulses to the group of memory cells (which are typically located along a given word line). After each programming iteration the cell storage values are read and verified, by comparing them to one or more programming thresholds. Subsequent programming pulses are applied selectively, only to the memory cells that have not yet reached the intended storage values.

In some embodiments, each built-in programming command has one or more attributes. Command attributes may comprise, for example, the programming thresholds used in the programming verification process (also referred to as PV levels). These thresholds determine the location of the different programming states on the threshold voltage axis. Another possible command attribute may comprise the R00 read threshold described above. Yet another type of command attribute may comprise a characteristic of the programming pulses, such as the amplitude or duration of the programming pulses, or the size of an incremental increase in amplitude between successive programming pulses. This attribute determines the accuracy at which the cells are programmed, and therefore the variance of the programming state distributions. Additionally or alternatively, the built-in programming commands may have any other suitable type of attribute.

In some embodiments, some or all of the command attributes can be set and modified by the MSP. The MSP and memory device may support a command or signal interface for transferring command attributes. Some aspects of exchanging command attributes between a memory controller and a memory device are addressed in U.S. Patent Application Publication 2008/0263262, entitled "Command Interface for Memory Devices," whose disclosure is incorporated herein by reference.

The programming states and the built-in programming commands in FIG. 2 are shown purely by way of example. In alternative embodiments, the methods and systems described herein can be used with any other suitable configuration of programming states and any other suitable set of built-in programming commands.

M Bits/Cell Storage Using N Bits/Cell Programming Commands, M>N

In some embodiments of the present invention, MSP 40 uses a memory device, which is designed and specified to store data at N bits/cell, to store data at a higher density of M bits/cell, M>N. In particular, the memory device may support a set of built-in programming commands that program the $i^{th}$ bits in the memory cells, i≤N. The MSP stores M bits in a group of memory cells of this memory device by performing a sequence of programming commands, which are drawn only from the set of built-in programming commands supported by the device.

The description that follows demonstrates processes of storing data at 3 bits/cell in a 2 bits/cell memory device that supports only PAGE_0 and PAGE_1 programming commands. These techniques, however, can be generalized in a straightforward manner to any desired values on N and M. Generally, M and N need not necessarily be integers. For example, data can be stored using six programming states. In the description below, the terms "page" and "bit" are sometimes used interchangeably. For example, a reference to "programming PAGE0 in a group of memory cells" is equivalent to "programming the $BIT_0$s of the memory cells in the group."

FIG. 3 is a diagram showing a process of storing data at three bits/cell using two bits/cell programming commands, in accordance with an embodiment of the present invention. The top graph in FIG. 3 shows the threshold voltage distribution in a group of cells after the first two pages (PAGE0 and PAGE1) have been programmed. MSP 40 typically programs the first two pages using the PAGE_0 and PAGE_1 programming commands supported by device 24, e.g., as shown in FIG. 2 above. After PAGE0 and PAGE1 are programmed, the threshold voltages of the memory cells are distributed in four programming states, in accordance with distributions 70A . . . 70D.

MSP 40 programs the third page (PAGE2) by applying a sequence of three PAGE_1 programming commands. First, the MSP applies a PAGE_1 programming command, which programs $BIT_2$ into the memory cells belonging to distributions 70A and 70B (i.e., to the memory cells that currently hold "11" and "10" data). The memory cells belonging to distributions 70C and 70D (i.e., to the memory cells that currently hold "00" and "01" data) are not affected at this stage. The result of the PAGE_1 programming command is shown in the second graph of FIG. 3. As can be seen in the figure, the first PAGE_1 programming command produces four distributions denoted S1 . . . S4, which represent the data bit combinations "111", "110", "100" and "101", respectively. Distributions 70C and 70D are unchanged.

In order to execute the PAGE_1 programming command appropriately, the MSP sets the PV levels of the command according to the desired locations of distributions (programming states) S1 . . . S4. The appropriate locations are below distributions 70C and 70D. In addition, the MSP sets read threshold R00 of the PAGE_1 programming command at or near 0V. Furthermore, when constructing the PAGE_1 command, the MSP sets the bit values programmed into the cells of distributions 70C and 70D, so as to prevent these cells from being affected by the P&V process. For example, the MSP may set the bit values programmed into these cells to "0". This setting corresponds to threshold voltages that are lower than the current cells' threshold voltages, and therefore the P&V process will not affect the memory cells in distributions 70C and 70D.

MSP 40 now applies another PAGE_1 programming command, which programs $BIT_2$ into the memory cells belonging to distribution 70C. This command produces two distributions (programming states) denoted S5 and S6, representing the bit value combinations "001" and "000", respectively. The result of the second PAGE_1 command is shown in the third graph of FIG. 3. In this command, read threshold R00 is set between distribution S4 and distribution 70C, and the PV levels are set to the desired positions of programming states S5 and S6. The bit values programmed into the memory cells in distributions S1 . . . S4 are set to "1", in order to prevent the P&V process from affecting them.

Finally, MSP 40 applies a third PAGE_1 programming command, which programs $BIT_2$ into the memory cells belonging to distribution 70D. This command produces two distributions (programming states) denoted S7 and S8, representing the bit value combinations "010" and "011", respectively. The result of this PAGE 1 command is shown in the bottom graph of FIG. 3. In the third PAGE_1 command, read threshold R00 is set between distribution S6 and distribution 70D, and the PV levels are set to the desired positions of programming states S7 and S8. The bit values programmed into the memory cells in distributions S1 . . . S4 are set to "1", in order to keep their threshold voltages unchanged.

The end result of the programming sequence is shown in the bottom graph of FIG. 3. As can be seen in the figure, MSP 40 has programmed a group of memory cells in a 2 bits/cell device at a density of 3 bits/cell (eight programming states), by applying a sequence of PAGE_0 and PAGE_1 built-in programming commands that are supported by the device. As can be appreciated, the programming time of PAGE2 is approximately three times the programming time of PAGE1. In many applications, however, the longer programming time is tolerable.

Figure 4:
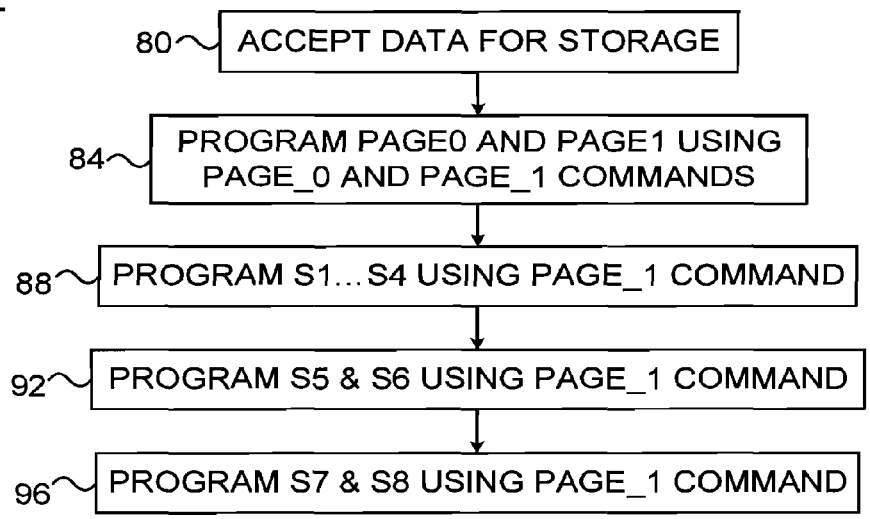
FIG. 4 is a flow chart that schematically illustrates a method for storing data at three bits/cell using two bits/cell programming commands, in accordance with an embodiment of the present invention.

FIG. 4 is a flow chart that schematically illustrates the above-described method for storing data at three bits/cell using two bits/cell programming commands, in accordance with an embodiment of the present invention. The method begins with MSP 40 accepts data for storage, at an input step 80. The MSP first programs PAGE0 and PAGE1 by applying PAGE_0 and PAGE_1 programming commands, at a first programming step 84. Then, the MSP produces programming states S1 . . . S4 by applying a PAGE_1 programming command, at a second programming step 88. The MSP then produces programming states S5 . . . S6 by applying another PAGE_1 programming command, at a third programming step 92. Finally, the MSP produces programming states S7 . . . S8 by applying yet another PAGE_1 programming command, at a fourth programming step 96. The MSP sets the command attributes (R00 and PV levels) for the different commands, as described with respect to FIG. 3 above.

M Bits/Cell Readout Using N Bits/Cell Read Commands, M>N

In some embodiments, MSP 40 reads data, which was stored in an N bits/cell memory device at a higher density of M bits/cell, M>N. In particular, the N bits/cell memory device typically supports a set of built-in read commands. Each read command reads the i$^{th}$ bit from a group of memory cells, for some i≤N. In some embodiments, the MSP reads M bits from each memory cell in the group by applying a series of read commands, which are drawn only from the set of built-in read commands supported by the memory device. As will be shown below, the MSP typically notifies the memory device of the read thresholds to be used in the different read commands in the series.

Some aspects of readout using built-in read commands are also described in U.S. Patent Application Publication 2009/0106485, entitled "Reading Analog Memory Cells using Built-In Multi-Threshold Commands," which is assigned to the assignee of the present patent application and whose disclosure is incorporated herein by reference.

Figure 5:
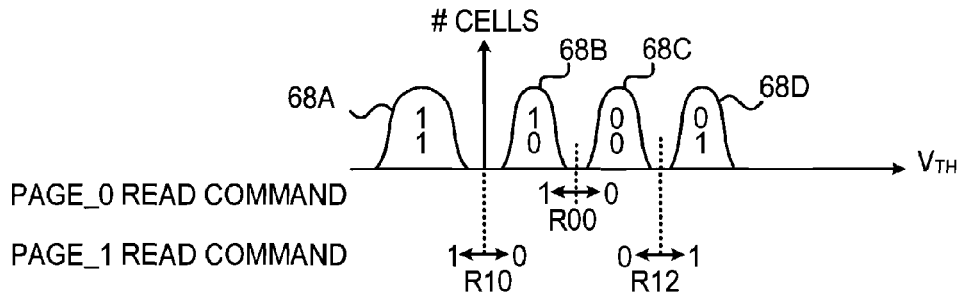
FIG. 5 is a diagram showing programming levels and a set of built-in read commands, in accordance with an embodiment of the present invention.

FIG. 5 is a diagram showing programming levels and a set of built-in read commands in a 2 bits/cell memory device, in accordance with an embodiment of the present invention. In the present example, the memory cells are programmed to four threshold voltage distributions 68A . . . 68D, which correspond to four respective programming states representing the bit value combinations "11", "10", "00" and "01".

R/W unit 36 of this memory device supports two built-in read commands: A PAGE_0 read command reads BIT° from a group of memory cells, and a PAGE_1 read command reads BIT$_1$ from the memory cells in the group. The PAGE_0 read command compares the threshold voltages of the memory cells to a read threshold denoted R00. Threshold voltages smaller than R00 are interpreted as BIT$_0$="1", and threshold voltages larger than R00 are interpreted as BIT$_0$="0". The PAGE_1 read command compares the threshold voltages of the memory cells to two read thresholds denoted R10 and R12. Threshold voltages that fall between R10 and R12 are interpreted as BIT$_1$="0". Threshold voltages that are smaller than R10 or larger than R12 are interpreted as BIT$_1$="1". In some embodiments, the values of read thresholds R00, R10 and R12 can be set and modified by the MSP or other memory controller.

The description that follows demonstrates a process of reading data, which was stored in this memory device at a density of 3 bits/cell, using only the built-in PAGE_0 and PAGE_1 read commands supported by the memory device. In alternative embodiments, the process can be generalized in a straightforward manner to any desired values of N and M. As noted above, M and N need not necessarily be integers.

Figure 6:
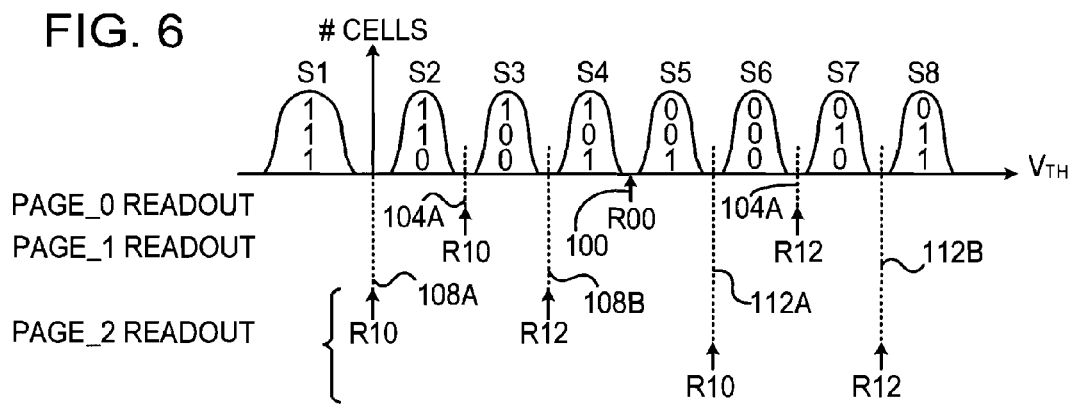
FIG. 6 is a diagram showing a process of reading data stored at three bits/cell using two bits/cell read commands, in accordance with an embodiment of the present invention.

FIG. 6 is a diagram showing a process of reading data stored at three bits/cell using two bits/cell read commands, in accordance with an embodiment of the present invention. In the present example, the memory cells are programmed to eight programming states denoted S1 . . . S8. A configuration of this sort can be produced, for example, by the process of FIGS. 3 and 4 above.

MSP 40 reads the data from the memory cells by applying a series of one PAGE_0 read command, followed by three PAGE_1 read commands. First, the MSP reads PAGE0 by applying a PAGE_0 read command, in which a read threshold (R00) 100 is positioned between S4 and S5. Threshold voltages smaller than threshold 100 are interpreted as BIT$_0$="1", and threshold voltages larger than threshold 100 are interpreted as BIT$_0$="0".

The MSP reads PAGE1 by applying a PAGE_1 read command, in which one read threshold (R10) 104A is positioned between S2 and S3, and a second read threshold (R12) 104B is positioned between S6 and S7. Threshold voltages that fall between the two thresholds are interpreted as BIT$_1$="0". Threshold voltages that are smaller than threshold 104A or larger than threshold 104B are interpreted as BIT$_1$="1".

The MSP reads PAGE2 by applying two additional PAGE_1 read commands. In one PAGE_1 read command, one read threshold (R10) 108A is positioned between S1 and S2, and another read threshold (R12) 108B is positioned between S3 and S4. In the other PAGE_1 read command, one read threshold (R10) 112A is positioned between S5 and S6, and another read threshold (R12) 112B is positioned between S7 and S8. Threshold voltages that fall between thresholds 108A and 108B, or between thresholds 112A and 112B, are interpreted as BIT$_2$="0". The other threshold voltages (i.e., threshold voltages smaller than threshold 108A, between thresholds 108B and 112A, or larger than threshold 112B) are interpreted as BIT$_2$="1".

Figure 7:
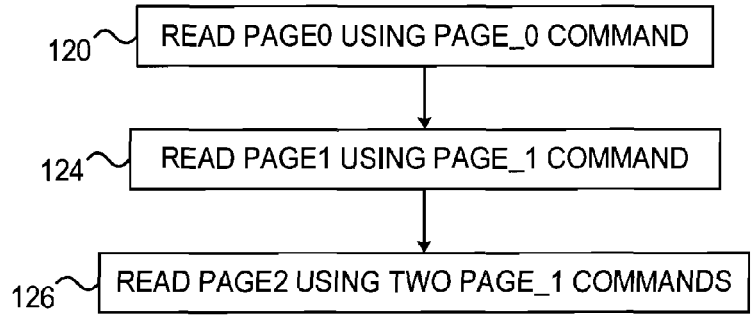
FIG. 7 is a flow chart that schematically illustrates a method for reading data stored at three bits/cell using two bits/cell programming commands, in accordance with an embodiment of the present invention.

FIG. 7 is a flow chart that schematically illustrates the above-described method for reading data stored at three bits/cell using two bits/cell programming commands, in accordance with an embodiment of the present invention. The method begins with MSP 40 reading PAGE0 using a built-in PAGE_0 read command, at a first readout step 120. The MSP reads PAGE1 using a built-in PAGE_1 read command, at a second readout step 124. The MSP reads PAGE2 using two built-in PAGE_1 read commands, as described above, at a third readout step 126. The MSP sets the read thresholds in each read command as described with respect to FIG. 6 above.

In some applications, data readout may be carried out using the above-described techniques, irrespective of how the data was programmed into the memory device in the first place. For example, in some applications (e.g., One-Time Programming (OTP) applications), the memory device is programmed by one entity and read by another entity. In these applications, programming of M bits/cell can be carried out using any suitable means, either using the disclosed techniques or otherwise. Data readout can be carried out by performing a series of N bits/cell read commands using the above-described techniques (e.g., the scheme of FIG. 7).

Alternative Programming Schemes

FIGS. 3 and 4 above demonstrated an example process of programming a 2 bits/cell memory device at a density of 3 bits/cell by applying a sequence of built-in programming commands that are supported by the device. The description below demonstrates several alternative processes, which use alternative sequences of built-in commands. Further alternatively, MSP 40 may use any other suitable command sequence.

Figure 8:
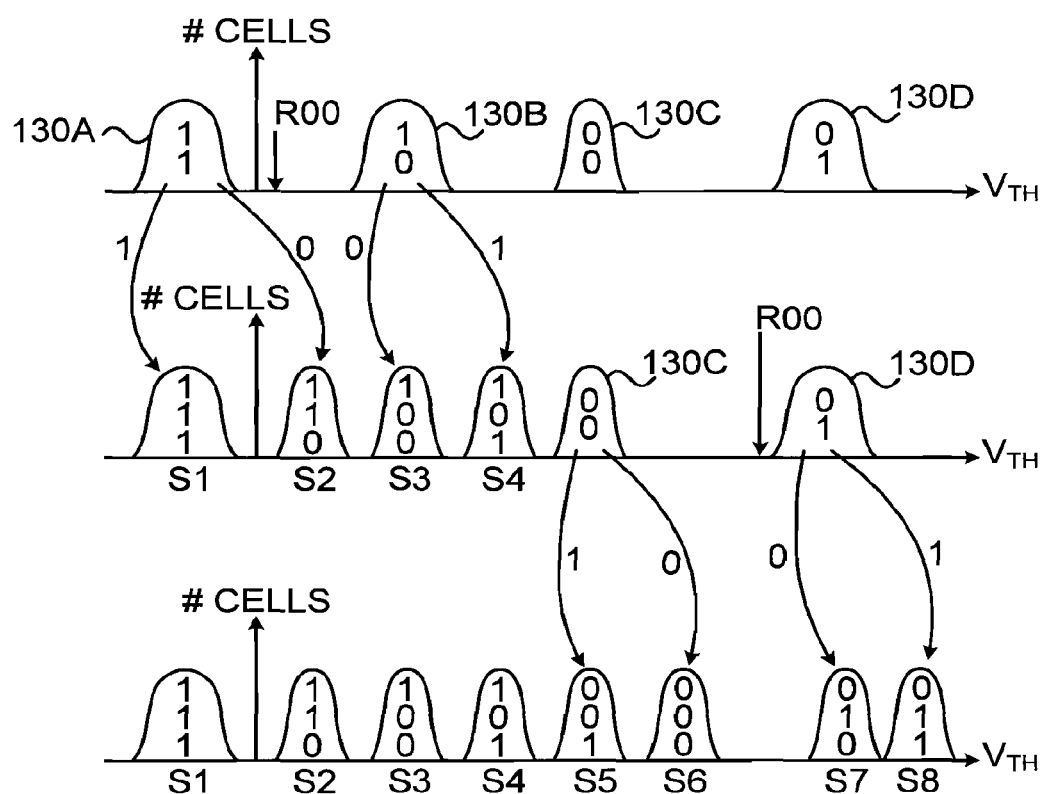

FIG. 8 is a diagram showing a process of data storage at three bits/cell using two bits/cell programming commands, in accordance with another embodiment of the present invention. In the present example, the MSP programs PAGE2 using two PAGE_1 programming commands (instead of three commands in the example of FIGS. 3 and 4 above).

Initially, the MSP programs PAGE0 and PAGE1 using PAGE_0 and PAGE_1 programming commands, to produce four threshold voltage distributions 130A . . . 130D. In the present embodiment, however, distribution 130C is programmed with high accuracy. This accuracy is similar to that of the 3 bits/cell distributions S1 . . . S8. This feature is in contrast to the method of FIG. 3 above, in which PAGE0 and PAGE1 are typically programmed at lower accuracy in order to reduce programming time. Programming with high accuracy can be carried out, for example, by instructing the R/W unit to apply shorter or lower-amplitude programming pulses, or to use a smaller amplitude increment between successive programming pulses. The MSP may instruct the R/W unit to modify the programming accuracy, such as by modifying the command attributes. The threshold voltage distribution at this stage is shown in the top graph of FIG. 8.

The MSP applies a PAGE_1 programming command that programs $BIT_2$ in the memory cells belonging to distributions 130A and 130B. The first PAGE_1 command produces distributions S1 . . . S4, as shown in the middle graph of FIG. 8. This stage is similar to the beginning of the process of FIG. 3 above. Then, the MSP applies a single PAGE_1 programming command that programs $BIT_2$ in the memory cells belonging to distributions 130C and 130D. Read threshold R00 is positioned immediately below distribution 130D for this command. The second command produces distributions S5 . . . S8, as shown in the bottom graph of FIG. 8. Between the first and second PAGE_1 programming commands, the MSP sets the bit values programmed into the cells of distributions S1 . . . S4 to "111", so as to prevent these cells from being affected by the P&V process.

The scheme of FIG. 8 provides faster programming time in comparison with the scheme of FIG. 3, because of the smaller number of programming commands in the sequence. At least part of this time saving, however, is compensated for by the additional time needed for programming distribution 130C with high accuracy. In an alternative embodiment, the MSP can program distribution 130C in two stages: (1) fast and rough programming of distributions 130A . . . 130D using a PAGE_1 command, and (2) high-accuracy trimming of distribution 130C using a PAGE_0 command. Since PAGE_0 programming commands are typically much faster than PAGE_1 programming commands, this technique reduces the overall programming time of PAGE1, while programming distribution 130C with high accuracy.

FIG. 9 is a diagram showing a process of data storage at three bits/cell using two bits/cell programming commands, in accordance with another alternative embodiment of the present invention. In this scheme, the MSP programs PAGE2 using a sequence of three PAGE_1 programming commands. The first command produces distributions S5 and S8 from the third and fourth distributions of PAGE1. R00 is positioned immediately below the fourth PAGE1 distribution in this command. The second command produces S4 and S7, with R00 positioned immediately above distribution S5. The third command produces S2 and S6, with R00 positioned at or near 0V. Distributions S1 and S3 correspond to the memory cells remaining in the original first and second PAGE1 distributions, respectively.

FIG. 10 is a diagram showing a process of data storage at three bits/cell using two bits/cell programming commands, in accordance with yet another embodiment of the present invention. In this scheme, MSP 40 programs PAGE2 using two PAGE_1 programming commands. The first command produces distributions S2, S4 and S5, with R00 positioned between the second and third PAGE1 distributions. The second command produces distributions S4, S7 and S8, with R00 positioned between distribution S5 and the fourth PAGE1 distribution. As noted above, at any given programming phase in FIG. 9 or 10, the MSP may set the bit values of certain distributions so as to prevent the P&V process form affecting these distributions.

In all of the programming schemes described herein, the order of the different programming steps in the sequence can be modified. In particular, the programming order can be selected so that higher programming states (i.e., programming states that correspond to high threshold voltages) are populated first. Programming higher programming states before lower programming states is sometimes advantageous for reducing impairments, such as disturb noise.

As noted above, some of the programming schemes described herein prevent the P&V process from affecting certain memory cells by selecting the bit values programmed into these cells. Some P&V processes, however, apply the first programming pulse before any verification takes place, i.e., regardless of whether the cells are already programmed to their intended threshold voltage levels or not. Such P&V processes will apply the first programming pulse to all the memory cells in the group, regardless of the programmed bit values. In most P&V processes, however, the first programming pulse is applied while biasing the memory cells' gates with a relatively low voltage. As a result, the first programming pulse will typically inject a relatively large amounts of charge into cells having small threshold voltages, and relatively small amounts of charge into cells having large threshold voltages. Thus, the effect of the first programming pulse can usually be tolerated, even for cells that have already reached their intended levels.

In general, programming an M bits/cell memory device at an N bits/cell density can be generalized as follows:
Store N bits/cell, using the built-in programming commands supported by the memory device.
Store the $(N+1)^{th}$ bit by performing the following:
Modify the $2^N-1$ programming thresholds, to program new $K_1$ programming levels.
Modify the $2^N-1$ programming thresholds, to program new $K_2$ programming levels.
Repeat J times, where $K_1+K_2+ \ldots +K_j=2^{N+1}$
Store bits N+2, . . . , M by repeating the steps above.

In some embodiments, the techniques described herein can be carried out by R/W unit 36, i.e., internally in memory device 24. In these embodiments, the MSP controls the memory device using M bits/cell commands. The R/W unit translates each M bits/cell command to a sequence of N bits/cell commands, using any of the above-described methods, and accesses the memory array using the sequence of N bits/cell commands. This sort of configuration enables, for example, designing an M bits/cell memory device on the basis of an existing N bits/cell design with little modification. In these embodiments, the R/W unit may comprise a controller that executes suitable microcode for performing these tasks.

In some embodiments, a given design of memory device may support two operational modes. One mode (referred to as a "high-reliability mode") stores data at N bits/cell, whereas the other mode (referred to as a "high-capacity mode") stores data at M bits/cell, M>N. In some embodiments, the selection whether to operate the memory device in the high-reliability or in the high-capacity mode is made during production. Thus, a given memory device (or batch of devices) can be preconfigured during production to function as N bits/cell or as M bits/cell devices. In the first mode, a maximum of N pages can be stored in a given group of memory cells. In the second mode, a maximum of M pages can be stored in a given cell group. Such dual-mode operation enables memory manufacturers to enjoy the economy-of-scale benefits of producing large volumes of a given design, while at the same time offering multiple products having different storage capacities and reliability levels.

Alternatively, mode configuration of the memory device can be carried out by the user, not during production. Consider, for example, a 4 GB 2 bits/cell memory device. Such a device can be partitioned by the user into two partitions—one providing 2 GB using 2 bits/cell storage, and the other providing 3 GB using 3 bits/cell storage. The total capacity of the device in this mode is thus 5 GB.

In addition to increasing the achievable capacity of memory devices, the disclosed methods and systems can also reduce hardware size and complexity in the memory device. For example, an N bits/cell memory device typically comprises N page buffers, in which the memory device caches N pages that are mapped to a certain group of memory cells. By using the methods and systems described herein, a memory device can store M bits/cell, M>N, using no more than N page buffers. The reduction in the number of page buffers translates to lower device cost, size and complexity.

Example Timing Schemes

When carrying out the methods and systems described herein, MSP 40 and memory device 24 (or multiple memory devices 24) may interact according to various timing schemes. In the example given below, memory device 24 comprises two memory planes, and MSP 40 stores and retrieves data in the two planes at a density of 3 bits/cell.

Figure 11:
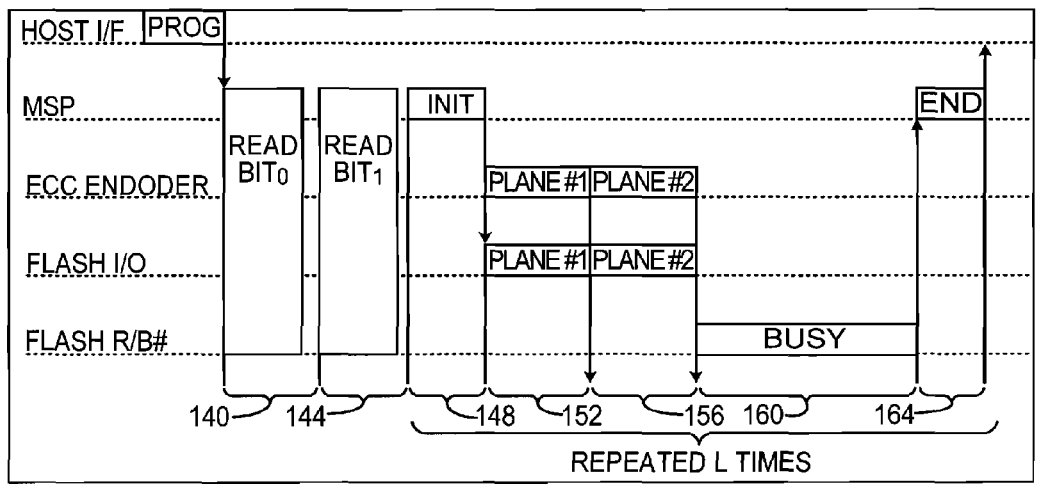
FIG. 11 is a timing diagram of a process for storing data at three bits/cell using two bits/cell programming commands, in accordance with an embodiment of the present invention.

FIG. 11 is a timing diagram of a process for storing data at three bits/cell using two bits/cell programming commands, in accordance with an embodiment of the present invention. The figure shows the process of programming $BIT_2$, or PAGE2. $BIT_0$ and $BIT_1$ are assumed to be programmed using any suitable scheme. The process begins with MSP 40 receiving from host 52 a request to program PAGE2 in a certain group of memory cells. As noted above, the programming state for a given memory cell depends on the $BIT_2$ value to be programmed, as well as on the previously-programmed $BIT_0$ and $BIT_1$ values.

Thus, in order to compute the appropriate programming states for programming PAGE2, the MSP reads PAGE0 and PAGE1 ($BIT_0$ and $BIT_1$) from the memory cells. $BIT_0$ is read during an interval 140, and $BIT_1$ is read during an interval 144. In some embodiments, the data stored in PAGE0 and/or PAGE1 is encoded with an Error Correction Code (ECC) prior to storage. In some embodiments, MSP 40 decodes the ECC of PAGE0 and/or PAGE1 in order to reduce the probability of read errors. Alternatively, the MSP may refrain from decoding the ECC to reduce latency. Further alternatively, the MSP may cache the data of PAGE0 and PAGE1 instead of reading it from the memory device.

During an interval 148, the MSP initializes its internal circuitry, as well as R/W unit 36 of the memory device. The MSP sends the PAGE2 data for programming, at intervals 152 and 156. In the present example, the memory device comprises two memory planes and storage is carried out using multi-plane programming commands. Thus, interval 148 is used for programming one plane, and interval 152 is used for programming the other plane. During an interval 160, the memory device is busy writing the data into its memory cells. The MSP waits until the storage operation is completed. At an interval 164, the MSP prepares for the next iteration, e.g., modifies the programming verification and read thresholds, and sets bit values in certain distributions so that they will not be affected by the P&V process. Steps 148-164 are typically repeated several times (denoted L times), depending on the specific programming scheme used and on the values of M and N.

In some embodiments, the memory device and MSP may reduce the PAGE2 programming time by caching and semi-parallelizing the L programming iterations. For example, the MSP may program the first and second planes of a given iteration (as in intervals 152 and 156), which in parallel the memory device is busy programming the previous iteration (as in step 160). Thus, for example, if L=3, then programming the two planes of the second and third iterations can overlap the busy period of the first and second iterations.

Figure 12:
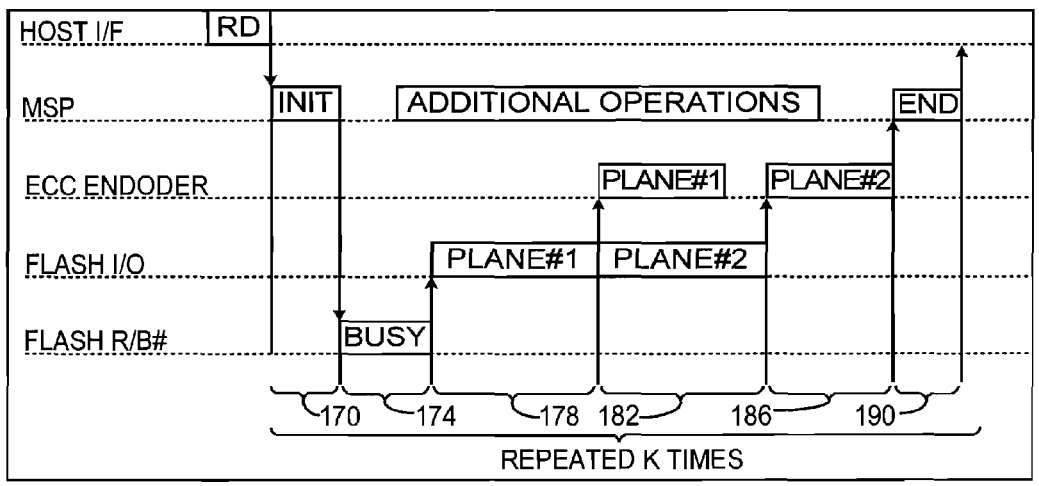
FIG. 12 is a timing diagram of a process for reading data stored at three bits/cell using two bits/cell read commands, in accordance with an embodiment of the present invention.

FIG. 12 is a timing diagram of a process for reading data stored at three bits/cell using two bits/cell read commands, in accordance with an embodiment of the present invention. The figure shows the process of reading $BIT_2$, or PAGE$_2$, using a series of K PAGE_1 read commands. The process begins with MSP 40 receiving from host 52 a request to read PAGE2 from a given group of memory cells. At a time interval 170, the MSP initializes its internal circuitry, as well as R/W unit 36 of the memory device. At an interval 174, the memory device is busy reading the data from the memory cells in response to the current PAGE_1 read command. In the present example, the memory device comprises two memory planes and data readout is carried out using multi-plane read commands. At an interval 178, the memory device outputs the data read from one plane. At an interval 182, the memory device outputs the data read from the second plane. In parallel, during interval 182 the MSP may decode the ECC of the data read from the first plane. At an interval 186, the MSP decodes the ECC of the data read from the second plane. At an interval 190, the MSP prepares for the next iteration, e.g., modifies the read thresholds and sets bit values in certain distributions so that they will not be affected by the P&V process, as explained above. Steps 170-190 are repeated K times, wherein K depends on the specific programming scheme used.

Although the embodiments described herein refer mainly to configurations in which the different bits that are mapped to a given memory cell belong to different logical pages, the methods and systems described herein are not limited to such configurations. In other words, the methods and systems described herein can be used to store M bits/cell in a group of N bits/cell memory cells, M>N, wherein the data stored in these cells is logically defined as less than M pages. The additional storage capacity gained by the disclosed techniques need not necessarily be used for storing user data (data provided by host 52). For example, some or all of the additional storage capacity can be designated for redundancy bits, thus enabling the use of a stronger ECC.

Although the embodiments described herein mainly address high-density storage in solid state memory devices, the methods and systems described herein can also be used in any other suitable application. The disclosed techniques can also be used to store M<N bits/cell in an N bits/cell device, wherein M is not an integer power of 2. For example, the MSP can program a 2 bits/cell (four-level) device with only three programming levels, so as to improve immunity to noise and distortion.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

What is claimed is:
1. A system, comprising:
a host processor;
a memory device, wherein the memory device includes a plurality of analog memory cells;
a memory processor coupled to the memory device, wherein the memory processor is configured to:
read a voltage level from a given one of the plurality of analog memory cells, wherein each analog memory cell of the plurality of analog memory cells is configured to be programmed to one of a plurality of programming states;

compare the read voltage level to a first threshold voltage, wherein the first threshold voltage is greater than a voltage level corresponding to a first programming state of the plurality of programming states and less than a voltage level corresponding to a second programming state of the plurality of programming state;

compare the read threshold voltage to a second threshold voltage, wherein the second threshold voltage is dependent upon a result of the comparison of the read voltage level to the first voltage level.

2. The system of claim 1, wherein a voltage level associated with a given programming state of the plurality of programming states corresponds to a respective one of a plurality of data bits combinations.

3. The system of claim 1, wherein the memory processor is further configured to determine a combination of data bits stored in the given one of the plurality of analog memory cells dependent upon the comparison of the read voltage level to the first and second threshold voltages.

4. The system of claim 3, wherein the memory processor is further configured to send the determined combination of data bits to the host processor.

5. The system of claim 1, wherein the memory device is organized into a plurality of pages.

6. The system of claim 1, wherein the memory device comprises a NAND Flash memory.

7. A computer-accessible non-transitory storage medium having instructions stored therein that, in response to execution by a processor, causes the processor to perform operations comprising:

reading a voltage level from a given one of the plurality of analog memory cells included in a memory, wherein each analog memory cell of the plurality of analog memory cells is configured to be programmed to one of a plurality of programming states;

comparing the read voltage level to a first threshold voltage, wherein the first threshold voltage is greater than a voltage level corresponding to a first programming state of the plurality of programming states and less than a voltage level corresponding to a second programming state of the plurality of programming state;

comparing the read threshold voltage to a second threshold voltage, wherein the second threshold voltage is dependent upon a result of the comparison of the read voltage level to the first voltage level.

8. The computer-accessible non-transitory storage medium of claim 7, wherein a voltage level associated with a given programming state of the plurality of programming states corresponds to a respective one of a plurality of data bit combinations.

9. The computer-accessible non-transitory storage medium of claim 7, wherein the operations further comprise determining a combination of data bits stored in the given one of the plurality of analog memory cells dependent upon the comparison of the read voltage level to the first and second threshold voltages.

10. The computer-accessible non-transitory storage medium of claim 9, wherein the operations further comprise sending the determined combination of data bits to a host processor.

11. The computer-accessible non-transitory storage medium of claim 8, wherein each data bit combination includes a plurality of data bits.

12. The computer-accessible non-transitory storage medium of claim 11, wherein the memory is organized into a plurality of pages, and wherein each data bit of the plurality of data bits corresponds to a respective one of the plurality of pages.

13. The computer-accessible non-transitory storage medium of claim 7, wherein the operations further comprise receiving data to be stored in a subset of the plurality of analog memory cells.

14. The computer-accessible non-transitory storage medium of claim 13, wherein the operations further comprise programming each analog memory cell of the subset of the plurality of analog memory cells to a selected one of the plurality of programming states, wherein the selected one of the plurality of programming states corresponds to a portion of the received data.

15. An apparatus, comprising:
a memory including a plurality of analog memory cells;
a processor coupled to the memory, wherein the processor is configured to:
read a voltage level from a given one of the plurality of analog memory cells, wherein each analog memory cell of the plurality of analog memory cells is configured to be programmed to one of a plurality of programming states;

compare the read voltage level to a first threshold voltage, wherein the first threshold voltage is greater than a voltage level corresponding to a first programming state of the plurality of programming states and less than a voltage level corresponding to a second programming state of the plurality of programming state;

compare the read threshold voltage to a second threshold voltage, wherein the second threshold voltage is dependent upon a result of the comparison of the read voltage level to the first voltage level.

16. The apparatus of claim 15, wherein a voltage level associated with a given programming state of the plurality of programming states corresponds to a respective one of a plurality of data bit combinations.

17. The apparatus of claim 15, wherein the processor is further configured to determine a combination of data bits stored in the given one of the plurality of analog memory cells dependent upon the comparison of the read voltage level to the first and second threshold voltage.

18. The apparatus of claim 15, wherein the processor is further configured to send the determined combination of data bits to a host processor.

19. The apparatus of claim 16, wherein each data bit combination includes a plurality of data bits.

20. The apparatus of claim 19, wherein the memory is organized into a plurality of pages, and wherein each data bit of the plurality of data bits corresponds to a respective one of the plurality of pages.

* * * * *